(12) United States Patent
Gan

(10) Patent No.: US 10,416,514 B2
(45) Date of Patent: Sep. 17, 2019

(54) PIXEL CIRCUIT AND LIQUID CRYSTAL DISPLAY CIRCUIT

(71) Applicant: Shenzhen China Star Optoelectronics Semiconductor Display Technology Co., Ltd., Shenzhen (CN)

(72) Inventor: Qiming Gan, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 70 days.

(21) Appl. No.: 15/742,553

(22) PCT Filed: Nov. 24, 2017

(86) PCT No.: PCT/CN2017/112872
§ 371 (c)(1),
(2) Date: Jan. 8, 2018

(87) PCT Pub. No.: WO2019/085093
PCT Pub. Date: May 9, 2019

(65) Prior Publication Data
US 2019/0129226 A1    May 2, 2019

(30) Foreign Application Priority Data
Oct. 30, 2017  (CN) .......................... 2017 1 1041093

(51) Int. Cl.
| | |
|---|---|
| *G02F 1/1362* | (2006.01) |
| *G02F 1/1368* | (2006.01) |
| *H01L 27/12* | (2006.01) |
| *G02F 1/1343* | (2006.01) |

(52) U.S. Cl.
CPC ........ *G02F 1/13624* (2013.01); *G02F 1/1368* (2013.01); *G02F 1/134309* (2013.01); *G02F 1/136213* (2013.01); *G02F 1/136286* (2013.01); *H01L 27/124* (2013.01); *G02F 2201/121* (2013.01); *G02F 2201/123* (2013.01); *G09G 2300/0439* (2013.01)

(58) Field of Classification Search
CPC .......... G02F 1/13624; G02F 1/134309; G02F 1/136213; G02F 1/136286; G02F 1/1368; G02F 2201/121; G02F 2201/123; H01L 27/124; G09G 2300/0439
See application file for complete search history.

(56) References Cited

U.S. PATENT DOCUMENTS

| | | | | |
|---|---|---|---|---|
| 8,339,534 B2* | 12/2012 | Lee | .......................... | G09G 3/3648 349/48 |
| 9,019,453 B2* | 4/2015 | Rho | .................. | G02F 1/134309 349/123 |
| 9,122,106 B2* | 9/2015 | Jung | ...................... | G02F 1/1343 |
| 9,223,182 B2* | 12/2015 | Yoon | .................. | G02F 1/136213 |
| 9,557,614 B2* | 1/2017 | Cheng | ............... | G02F 1/133707 |
| 9,704,889 B2* | 7/2017 | Kim | ..................... | G02F 1/13624 |
| 9,726,952 B2* | 8/2017 | Yoon | ................ | G02F 1/136213 |

(Continued)

*Primary Examiner* — Peter D McLoone

(57) ABSTRACT

The present disclosure provides a pixel circuit and a liquid crystal display circuit. The pixel circuit comprises a gate line, a data line, a first common line, a second common line, a first primary field-effect transistor (FET), a second primary FET, a first secondary FET, and a second secondary FET. A voltage of the first common line is different from a voltage of the second common line.

19 Claims, 1 Drawing Sheet

(56) References Cited

U.S. PATENT DOCUMENTS

| | | | |
|---|---|---|---|
| 9,835,922 B2* | 12/2017 | Cheng | G02F 1/1368 |
| 10,222,655 B2* | 3/2019 | Gan | G02F 1/133514 |
| 2010/0032677 A1* | 2/2010 | Lee | G09G 3/3648 |
| | | | 257/71 |
| 2012/0224128 A1* | 9/2012 | Jung | G02F 1/134309 |
| | | | 349/129 |
| 2013/0077002 A1* | 3/2013 | Yoon | G02F 1/136213 |
| | | | 349/38 |
| 2013/0215341 A1* | 8/2013 | Rho | G02F 1/134309 |
| | | | 349/15 |
| 2016/0131951 A1* | 5/2016 | Lee | G02F 1/13624 |
| | | | 349/39 |
| 2016/0291367 A1* | 10/2016 | Cheng | G02F 1/1368 |
| 2016/0299392 A1* | 10/2016 | Cheng | G02F 1/133707 |
| 2017/0108723 A1* | 4/2017 | No | G02F 1/1368 |
| 2018/0299734 A1* | 10/2018 | Gan | G02F 1/133514 |

* cited by examiner

PIXEL CIRCUIT AND LIQUID CRYSTAL DISPLAY CIRCUIT

RELATED APPLICATIONS

This application is a National Phase of PTC Patent Application No. PCT/CN2017/112872 having International filing date of Nov. 24, 2017, which claims the benefit of priority of Chinese Patent Application No. 201711041093.2 filed on Oct. 30, 2017. The contents of the above applications are all incorporated by reference as if fully set forth herein in their entirety.

FIELD AND BACKGROUND OF THE INVENTION

The present disclosure relates to the field of liquid crystal displays, and more particularly to a pixel circuit and a liquid display panel circuit.

Eight-domain pixel structures lead the design trend for large dimension TVs. An eight-domain pixel is composed of a primary display area (primary area), a secondary display area (secondary area), and four different types of directing film. However, balance of a common voltage between the primary area and the secondary area becomes a dilemma due to high display resolution and high refresh rate. It becomes a problem when utilizing three transistor (3T) pixels.

The common voltage in the secondary area will be pulled down because in the present 3T pixel circuit structure, only the secondary area has a discharging path for a common electrode. Therefore, it is nearly impossible for the common voltage in the secondary area to reach an ideal level.

Therefore, defects of present technology urgently require improvement.

SUMMARY OF THE INVENTION

The object of this disclosure is to provide a pixel circuit and a liquid crystal display circuit to enhance the balance of common voltage between the primary area and the secondary area.

To solve the above-mentioned technical problems, the techniques that present disclosure provides are as follows.

The present disclosure provides a pixel circuit comprising:
  a gate line configured to transmit a gate voltage;
  a data line configured to transmit a data voltage;
  a first common line configured to transmit a first common voltage;
  a second common line configured to transmit a second common voltage;
  a first primary field effect transistor (FET) comprising a source coupled to the data line, a gate coupled to the gate line, and a drain coupled to a pixel capacitor;
  a second primary FET comprising a source coupled to the drain of the first primary FET and coupled to the first common line through a primary storage capacitor, a gate coupled to the gate line, and a drain coupled to the second common line through a primary shared capacitor;
  a first secondary FET comprising a source coupled to the data line, a gate coupled to the gate line, and a drain coupled to a secondary pixel capacitor;
  a second secondary FET comprising a source coupled to the drain of the first secondary FET and coupled to the second common line through a secondary storage capacitor, a gate coupled to the gate line, and a drain coupled to the first common line;
  wherein a voltage of the first common line is different from a voltage of the second common line; and
  the pixel circuit further comprises:
  a first primary pixel electrode coupled to the source of the second primary FET; and
  a first primary common electrode coupled to the first common line;
  wherein the first primary pixel electrode and the first primary pixel electrode compose the primary storage capacitor; and
  the first primary FET, the second primary FET, the first secondary FET, and the second secondary FET are thin film transistors.

The pixel circuit of present disclosure further comprises a first secondary common electrode coupled to the second common line and a first secondary pixel electrode coupled to the drain of the second secondary FET;
  wherein the first secondary common electrode and the first secondary pixel electrode compose the secondary storage capacitor.

The pixel circuit of present disclosure further comprises a primary metal layer coupled to the drain of the second primary FET, wherein the primary metal layer and the first secondary common electrode compose the primary shared capacitor.

In the pixel circuit of present disclosure, the drain of the second primary FET is coupled to the first common line through a secondary shared capacitor.

The pixel circuit of present disclosure further comprises a secondary metal layer coupled to the drain of the second secondary FET, wherein the secondary metal layer and the first primary common electrode compose the secondary shared capacitor.

The present disclosure further provides a pixel circuit which comprises:
  a gate line configured to transmit a gate voltage;
  a data line configured to transmit a data voltage;
  a first common line configured to transmit a first common voltage;
  a second common line configured to transmit a second common voltage;
  a first primary field effect transistor (FET) comprising a source coupled to the data line, a gate coupled to the gate line, and a drain coupled to a pixel capacitor;
  a second primary FET comprising a source coupled to the drain of the first primary FET and coupled to the first common line through a storage capacitor, a gate coupled to the gate line, and a drain coupled to the second common line through a primary shared capacitor;
  a first secondary FET comprising a source coupled to the data line, a gate coupled to the gate line, and a drain coupled to a secondary pixel capacitor;
  a second secondary FET comprising a source coupled to the drain of the first secondary FET and coupled to the second common line through a secondary storage capacitor, a gate coupled to the gate line, and a drain coupled to the first common line; wherein
  a voltage of the first common line is different from a voltage of the second common line.

The pixel circuit of present disclosure further comprises a first primary pixel electrode coupled to the source of the second primary FET and a first primary common electrode coupled to the first common line. Wherein the first primary pixel electrode and the first primary pixel electrode compose the primary storage capacitor.

The pixel circuit of present disclosure further comprises a first secondary common electrode coupled to the second common line and a first secondary pixel electrode coupled to the drain of the second primary FET, wherein the first secondary common electrode and the first secondary pixel electrode compose the secondary storage capacitor.

The pixel circuit of present disclosure further comprises a primary metal layer coupled to the drain of the second primary FET, wherein the primary metal layer and the first secondary common electrode compose the primary shared capacitor.

In the pixel circuit of present disclosure, the drain of the second primary FET is coupled to the first common line through a secondary shared capacitor.

The pixel circuit of present disclosure further comprises a secondary metal layer coupled to the drain of the second secondary FET, wherein the secondary metal layer and the first primary common electrode compose the secondary shared capacitor.

In the pixel circuit of present disclosure, the first primary FET, the second primary FET, the first secondary FET, and the second secondary FET are thin film transistors.

The present disclosure further comprises a liquid crystal display circuit comprising a pixel circuit, wherein the pixel circuit further comprises:
 a gate line configured to transmit a gate voltage;
 a data line configured to transmit a data voltage;
 a first common line configured to transmit a first common voltage;
 a second common line configured to transmit a second common voltage;
 a first primary field effect transistor (FET) comprising a source coupled to the data line, a gate coupled to the gate line, and a drain coupled to a pixel capacitor;
 a second primary FET comprising a source coupled to the drain of the first primary FET and coupled to the first common line through a storage capacitor, a gate coupled to the gate line, and a drain coupled to the second common line through a primary shared capacitor;
 a first secondary FET comprising a source coupled to the data line, a gate coupled to the gate line, and a drain coupled to a secondary pixel capacitor;
 a second secondary FET comprising a source coupled to the drain of the first secondary FET and coupled to the second common line through a secondary storage capacitor, a gate coupled to the gate line, and a drain coupled to the first common line; wherein
 a voltage of the first common line is different from a voltage of the second common line.

The liquid display panel circuit of present disclosure further comprises a first primary pixel electrode coupled to the source of the second primary FET and a first primary common electrode coupled to the first common line, wherein the first primary pixel electrode and the first primary pixel electrode compose the primary storage capacitor.

The liquid display panel circuit of present disclosure further comprises a first secondary common electrode coupled to the second common line and a first secondary pixel electrode coupled to the drain of the second primary FET, wherein the first secondary common electrode and the first secondary pixel electrode compose the secondary storage capacitor.

In the liquid display panel circuit of present disclosure, the pixel circuit further comprises a primary metal layer coupled to the drain of the second primary FET, wherein the primary metal layer and the first secondary common electrode compose the primary shared capacitor.

In the liquid display panel circuit of present disclosure, the drain of the second primary FET is coupled to the first common line through a secondary shared capacitor.

In the liquid display panel circuit of present disclosure, the pixel circuit further comprises a secondary metal layer coupled to the drain of the second secondary FET, wherein the secondary metal layer and the first primary common electrode compose the secondary shared capacitor.

In the liquid display panel circuit of present disclosure, the first primary FET, the second primary FET, the first secondary FET, and the second secondary FET are thin film transistors.

In the pixel circuit and the liquid display panel circuit of present disclosure, the ratio of voltages in the primary area to voltages in the secondary area can be maintained by disposing a primary shared capacitor. The primary shared capacitor is utilized to control the variation between the first common voltage of the first common line in the primary area and the second common voltage of the second common line in the secondary area. Therefore, the balance of common voltage between the primary area and secondary area can be improved.

DESCRIPTION OF SPECIFIC EMBODIMENTS OF THE INVENTION

Figure 1:
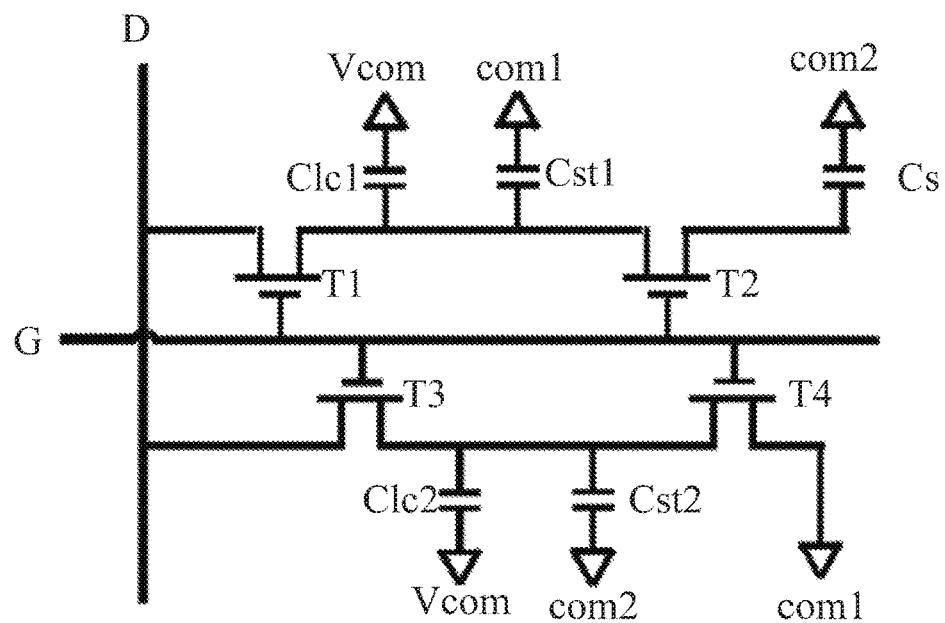
FIG. 1 illustrates a structure of a preferable embodiment of a pixel circuit.

The illustrations of the following embodiments take the attached drawings as reference to indicate the applicable specific examples of the present disclosure. The mentioned directional terms, such as upper, lower, front, back, left, right, inner, outer, side, etc., are only directions by referring to the accompanying drawings, and thus the used directional terms are used to describe and understand the present invention, but the present invention is not limited thereto.

In the drawings, the similar modules are numbered with the same reference numbers.

Please refer to FIG. 1 which illustrates a preferable embodiment of a pixel circuit. The pixel circuit comprises a gate line G, a data line D, a first common line com1, a second common line com2, a first primary field-effect transistor (FET) T1, a second primary FET T2, a first secondary FET T3, and a second secondary FET T4.

The gate line G is utilized to transmit a gate voltage, in order to control the first primary FET T1, the second primary FET T2, the first secondary FET T3, and the second secondary FET T4 to be in conduction or saturation mode.

The data line D is utilized to transmit a data voltage to the first primary FET T1 and the first secondary FET T3.

The first common line com1 is utilized to transmit a first common voltage Vcom1, and is coupled to the first primary common electrode com1.

The second common line com2 is utilized to transmit a second common voltage Vcom2.

A source of the first primary FET T1 is coupled to the data line D. A gate of the first primary FET T1 is coupled to the gate line G. A drain of the first primary FET T1 is coupled to a primary pixel capacitor Clc1. Another side of the primary pixel capacitor Clc1 receives a common voltage Vcom.

A source of the second primary FET T2 is coupled to the drain of the first primary FET T1. The source of the second primary FET T2 is also coupled to the first common line com1 through a primary storage capacitor Cst1. A gate of the second primary FET T2 is coupled to the gate line G. A drain of the second primary FET T2 is coupled to the second common line com2.

A source of the first secondary FET T3 is coupled to the data line D. A gate of the first secondary FET T3 is coupled to the gate line G. A drain of the first secondary FET T3 is coupled to a secondary capacitor Clc2. Another side of the secondary capacitor Clc2 receives the common voltage Vcom.

A source of the second secondary FET T4 is coupled to the drain of the first secondary FET T3. The source of the second secondary FET T4 is also coupled to the second common line com2 through a primary storage capacitor Cst2. A gate of the second secondary FET T4 is coupled to the gate line G. A drain of the second secondary FET T4 is coupled to the first common line com1.

In practical application, the pixel circuit comprises a first primary pixel electrode, a first primary common electrode, a primary metal layer, a first secondary electrode, and a first secondary pixel electrode.

The first primary pixel electrode is coupled to the source of the second primary FET T2. The first primary common electrode is coupled to the first common line com1. The first primary pixel electrode and the first primary common electrode compose the primary storage capacitor Cst1.

The first secondary common electrode is coupled to the second common line com2. The first secondary pixel electrode is coupled to the source of the second secondary FET T4. The first secondary common electrode and the first secondary pixel electrode compose the secondary storage capacitor Cst2.

The primary metal layer is coupled to the drain of the second primary FET T2. The primary metal layer and the first secondary common electrode compose the shared capacitor Cs.

Figure 2:
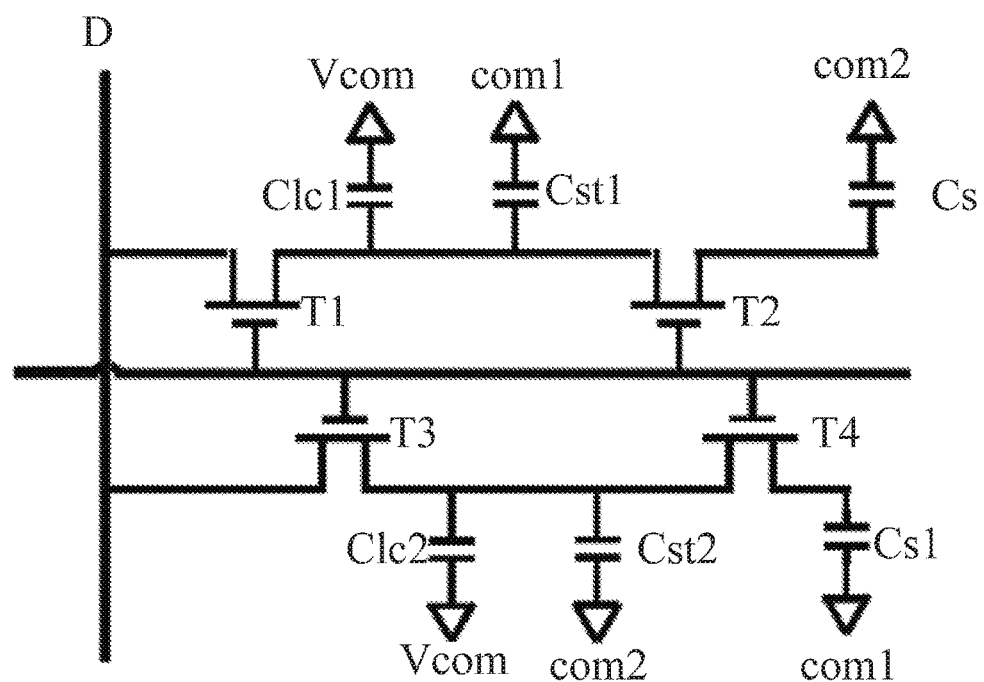
FIG. 2 illustrates another structure of a preferable embodiment of a pixel circuit.

Please refer to FIG. 2. In another embodiment, the pixel circuit comprises a secondary shared capacitor Cs1. A drain of the second primary FET T4 is coupled to the first common line cord through the secondary shared capacitor Cs1.

In practical application, the pixel circuit further comprises a secondary metal layer. The secondary metal layer is coupled to the drain of the second secondary FET T4. The secondary metal layer and the first primary common electrode compose the secondary shared capacitor Cs1.

Present disclosure further provides a liquid display circuit which comprises the above-mentioned pixel circuit. The plurality of pixel circuits is arranged in array. Pixel circuits of the same row are connected one by one through their gate lines. Pixel circuits of the same column are connected one by one through their data lines. That is, pixel circuits of the same row share the same gate line, and pixel circuits of the same column share the same data line.

In the pixel circuit and liquid crystal display circuit provided in the present disclosure, the ratio of voltages in primary area to voltages in secondary area can be maintained by disposing a primary shared capacitor. The shared capacitor is utilized to control the variation between the first common voltage of the first common line in primary area and the second common voltage of the second common line secondary area. Therefore, the balance of common voltage between primary area and secondary area can be improved.

In conclusion, although this disclosure has been disclosed through the preferable embodiments above, the preferable embodiments above are not utilized to limit this disclosure. One having ordinary skills can change and modify without violating the concepts and scope of this disclosure. Therefore, the scope that this disclosure protects is based on the scope defined by the claims.

What is claimed is:
1. A pixel circuit, comprising:
   a gate line configured to transmit a gate voltage;
   a data line configured to transmit a data voltage;
   a first common line configured to transmit a first common voltage;
   a second common line configured to transmit a second common voltage;
   a first primary field effect transistor (FET) comprising a source coupled to the data line, a gate coupled to the gate line, and a drain coupled to a pixel capacitor;
   a second primary FET comprising a source coupled to the drain of the first primary FET and coupled to the first common line through a primary storage capacitor, a gate coupled to the gate line, and a drain coupled to the second common line through a primary shared capacitor;
   a first secondary FET comprising a source coupled to the data line, a gate coupled to the gate line, and a drain coupled to a secondary pixel capacitor;
   a second secondary FET comprising a source coupled to the drain of the first secondary FET and coupled to the second common line through a secondary storage capacitor, a gate coupled to the gate line, and a drain coupled to the first common line;
   wherein a voltage of the first common line is different from a voltage of the second common line;
   the pixel circuit further comprises:
   a first primary pixel electrode coupled to the source of the second primary FET; and
   a first primary common electrode coupled to the first common line;
   wherein the first primary pixel electrode and the first primary common electrode compose the primary storage capacitor; and
   the first primary FET, the second primary FET, the first secondary FET, and the second secondary FET are thin film transistors.

2. The pixel circuit according to claim 1, further comprising:
   a first secondary common electrode coupled to the second common line; and
   a first secondary pixel electrode coupled to the drain of the second secondary FET;
   wherein the first secondary common electrode and the first secondary pixel electrode compose the secondary storage capacitor.

3. The pixel circuit according to claim 2, further comprising:
   a primary metal layer coupled to the drain of the second primary FET, wherein the primary metal layer and the first secondary common electrode compose the primary shared capacitor.

4. The pixel circuit according to claim 2, wherein the drain of the second primary FET is coupled to the first common line through a secondary shared capacitor.

5. The pixel circuit according to claim 4, further comprising: a secondary metal layer coupled to the drain of the second secondary FET, wherein the secondary metal layer and the first primary common electrode compose the secondary shared capacitor.

6. A pixel circuit, comprising:
a gate line configured to transmit a gate voltage;
a data line configured to transmit a data voltage;
a first common line configured to transmit a first common voltage;
a second common line configured to transmit a second common voltage;
a first primary field effect transistor (FET) comprising a source coupled to the data line, a gate coupled to the gate line, and a drain coupled to a pixel capacitor;
a second primary FET comprising a source coupled to the drain of the first primary FET and coupled to the first common line through a storage capacitor, a gate coupled to the gate line, and a drain coupled to the second common line through a primary shared capacitor;
a first secondary FET comprising a source coupled to the data line, a gate coupled to the gate line, and a drain coupled to a secondary pixel capacitor;
a second secondary FET comprising a source coupled to the drain of the first secondary FET and coupled to the second common line through a secondary storage capacitor, a gate coupled to the gate line, and a drain coupled to the first common line;
wherein a voltage of the first common line is different from a voltage of the second common line.

7. The pixel circuit according to claim 6, further comprising:
a first primary pixel electrode coupled to the source of the second primary FET; and
a first primary common electrode coupled to the first common line;
wherein the first primary pixel electrode and the first primary common electrode compose the primary storage capacitor.

8. The pixel circuit according to claim 7, further comprising:
a first secondary common electrode coupled to the second common line; and
a first secondary pixel electrode coupled to the drain of the second primary FET;
wherein the first secondary common electrode and the first secondary pixel electrode compose the secondary storage capacitor.

9. The pixel circuit according to claim 8, further comprising: a primary metal layer coupled to the drain of the second primary FET, wherein the primary metal layer and the first secondary common electrode compose the primary shared capacitor.

10. The pixel circuit according to claim 8, wherein the drain of the second primary FET is coupled to the first common line through a secondary shared capacitor.

11. The pixel circuit according to claim 10, further comprising: a secondary metal layer coupled to the drain of the second secondary FET, wherein the secondary metal layer and the first primary common electrode compose the secondary shared capacitor.

12. The pixel circuit according to claim 6, wherein the first primary FET, the second primary FET, the first secondary FET, and the second secondary FET are thin film transistors.

13. A liquid crystal display circuit, comprising: a pixel circuit comprising:
a gate line configured to transmit a gate voltage;
a data line configured to transmit a data voltage;
a first common line configured to transmit a first common voltage;
a second common line configured to transmit a second common voltage;
a first primary field effect transistor (FET) comprising a source coupled to the data line, a gate coupled to the gate line, and a drain coupled to a pixel capacitor;
a second primary FET comprising a source coupled to the drain of the first primary FET and coupled to the first common line through a storage capacitor, a gate coupled to the gate line, and a drain coupled to the second common line through a primary shared capacitor;
a first secondary FET comprising a source coupled to the data line, a gate coupled to the gate line, and a drain coupled to a secondary pixel capacitor;
a second secondary FET comprising a source coupled to the drain of the first secondary FET and coupled to the second common line through a secondary storage capacitor, a gate coupled to the gate line, and a drain coupled to the first common line; wherein
a voltage of the first common line is different from a voltage of the second common line.

14. The liquid crystal display circuit according to claim 13, wherein the pixel circuit further comprises:
a first primary pixel electrode coupled to the source of the second primary FET; and
a first primary common electrode coupled to the first common line;
wherein the first primary pixel electrode and the first primary common electrode compose the primary storage capacitor.

15. The liquid crystal display circuit according to claim 14, wherein the pixel circuit further comprises:
a first secondary common electrode coupled to the second common line; and
a first secondary pixel electrode coupled to the drain of the second primary FET;
wherein the first secondary common electrode and the first secondary pixel electrode compose the secondary storage capacitor.

16. The liquid crystal display circuit according to claim 15, wherein the pixel circuit further comprises: a primary metal layer coupled to the drain of the second primary FET, wherein the primary metal layer and the first secondary common electrode compose the primary shared capacitor.

17. The liquid crystal display circuit according to claim 15, wherein the drain of the second primary FET is coupled to the first common line through a secondary shared capacitor of the pixel circuit.

18. The liquid crystal display circuit according to claim 17, wherein the pixel circuit further comprises: a secondary metal layer coupled to the drain of the second secondary FET, wherein the secondary metal layer and the first primary common electrode compose the secondary shared capacitor.

19. The liquid crystal display circuit according to claim 13, wherein the first primary FET, the second primary FET, the first secondary FET, and the second secondary FET are thin film transistors.

* * * * *